United States Patent
Choi et al.

(10) Patent No.: US 8,105,930 B2
(45) Date of Patent: Jan. 31, 2012

(54) METHOD OF FORMING DIELECTRIC INCLUDING DYSPROSIUM AND SCANDIUM BY ATOMIC LAYER DEPOSITION AND INTEGRATED CIRCUIT DEVICE INCLUDING THE DIELECTRIC LAYER

(75) Inventors: Hoonsang Choi, Seoul (KR); Bongjin Kuh, Suwon-si (KR); Sunjung Kim, Suwon-si (KR); Youngsun Kim, Suwon-si (KR); Seunghwan Lee, Suwon-si (KR); Sangwook Lim, Yongin-si (KR); Chunhyung Chung, Yongin-si (KR)

(73) Assignee: Samsung Electronics Co., Ltd., Gyeonngi-do (KR)

( * ) Notice: Subject to any disclaimer, the term of this patent is extended or adjusted under 35 U.S.C. 154(b) by 629 days.

(21) Appl. No.: 12/153,952

(22) Filed: May 28, 2008

(65) Prior Publication Data

US 2009/0039415 A1   Feb. 12, 2009

(30) Foreign Application Priority Data

Aug. 7, 2007   (KR) .................. 10-2007-0079172

(51) Int. Cl.
*H01L 21/3205*  (2006.01)
*H01L 21/4763*  (2006.01)

(52) U.S. Cl. ............... 438/591; 438/240; 257/E21.192

(58) Field of Classification Search .............. 438/240, 438/591; 257/E21.192
See application file for complete search history.

(56) References Cited

U.S. PATENT DOCUMENTS

| | | | |
|---|---|---|---|
| 6,858,906 B2 | 2/2005 | Lee et al. | |
| 7,002,788 B2 | 2/2006 | Jeong et al. | |
| 7,005,302 B2 | 2/2006 | Xiang | |
| 7,102,875 B2 | 9/2006 | Lee et al. | |
| 7,508,648 B2* | 3/2009 | Ahn et al. ............... | 361/311 |
| 2001/0003664 A1 | 6/2001 | Yamaguchi | |
| 2006/0022252 A1 | 2/2006 | Doh et al. | |
| 2006/0157733 A1* | 7/2006 | Lucovsky et al. ......... | 257/192 |
| 2006/0163676 A1 | 7/2006 | Shimizu et al. | |
| 2006/0255396 A1 | 11/2006 | Nara | |
| 2007/0128736 A1 | 6/2007 | Chang et al. | |
| 2007/0272967 A1* | 11/2007 | Pantisano et al. ......... | 257/315 |
| 2008/0308881 A1* | 12/2008 | De Gendt et al. ........ | 257/410 |

(Continued)

FOREIGN PATENT DOCUMENTS

JP   09-051074   2/1997

(Continued)

OTHER PUBLICATIONS

Adelmann et al., "Growth of Dysprosium-, Scandium-, and Hafnium-based Third Generation High-k Dielectrics by Atomic Vapor Deposition", Chem. Vap. Deposition 2007, 13, pp. 567-573.*

(Continued)

*Primary Examiner* — Lex Malsawma

(74) *Attorney, Agent, or Firm* — Harness, Dickey & Pierce, PLC (57) ABSTRACT

In one embodiment, the method of forming a dielectric layer includes supplying a first precursor at a temperature less than 400 degrees Celsius to a chamber including a substrate. The first precursor includes dysprosium. A first reaction gas is supplied to the chamber to react with the first precursor. A second precursor is supplied at a temperature less than 400 degrees Celsius to the chamber, and the second precursor includes scandium. A second reaction gas is supplied to the chamber to react with the second precursor.

23 Claims, 8 Drawing Sheets

U.S. PATENT DOCUMENTS

2009/0001443 A1 * 1/2009 Krishnamohan et al. ..... 257/316

FOREIGN PATENT DOCUMENTS

| JP | 2001-168301 | 6/2001 |
|----|-------------|--------|
| JP | 2003-124348 | 4/2003 |
| KR | 10-2005-0002027 | 1/2005 |
| KR | 10-2005-0020759 | 3/2005 |
| KR | 10-2005-0092880 | 9/2005 |
| KR | 10-2006-0041355 | 5/2006 |
| KR | 10-2006-0052474 | 5/2006 |
| KR | 10-2006-0080463 | 7/2006 |
| KR | 10-2007-0001454 | 1/2007 |
| KR | 10-2007-0012458 | 1/2007 |

OTHER PUBLICATIONS

Office Action for corresponding Korean Application No. 10-2007-0079172 dated Jan. 28, 2010.
Japanese Journal of Applied Physics, vol. 45, No. 31, 2006, pp. L830-L832.
Journal of the Electrochemical Society, 154 (7) G9147-G154 (2007).
Journal of the Electrochemical Society, 153 (9) F219-F224 (2006).
Office Action for corresponding Korean Application No. 10-2007-0079172 dated Aug. 7, 2009.
Office Action for corresponding Korean Application No. 10-2007-0079172 dated Feb. 19, 2009.

* cited by examiner

METHOD OF FORMING DIELECTRIC INCLUDING DYSPROSIUM AND SCANDIUM BY ATOMIC LAYER DEPOSITION AND INTEGRATED CIRCUIT DEVICE INCLUDING THE DIELECTRIC LAYER

This application claims priority under 35 U.S.C. 119 on Korean Application No. 2007-0079172 filed Aug. 7, 2007; the entire contents of which are hereby incorporated by reference.

BACKGROUND

Several different integrated circuit elements rely on the use of dielectrics. For example, capacitors in integrated circuits rely on dielectrics to improve capacitance. Capacitance is proportional to the dielectric constant of the dielectric as well as the surface area of the capacitor. As integration density increases, however, the area of capacitors decreases. Loss of capacitance from reduced area may be mitigated by using dielectrics with higher dielectric constants.

As another example, a flash memory structure includes a tunnel oxide, charge trap layer, blocking oxide and gate electrode formed over a substrate. Dielectrics serve as the blocking oxide, which reduces the back-tunneling effect and increases the erase efficiency. These beneficial effects are greater the higher the dielectric constant of the dielectric layer used as the blocking oxide.

SUMMARY

A dielectric including dysprosium and scandium such as $Dy_xSC_yO_3$ has a very high dielectric constant, and is a desirable candidate for use in integrated circuits that rely on dielectrics. Known techniques for forming $Dy_xSC_yO_3$ include metal organic chemical vapor deposition (MOCVD) and pulsed laser deposition (PLD). While these techniques may prove useful in certain applications, these techniques for forming $Dy_xSC_yO_3$ are unsuitable for many integrated circuit applications.

In light of these failings with conventional processes, the inventors developed an atomic layer deposition process for forming dielectrics including dysprosium and scandium such as $Dy_xSC_yO_3$. The resulting dielectric including dysprosium and scandium has good uniformity, good step coverage, and permits effective control over the thickness of the dielectric.

For example, in one embodiment, the method of forming a dielectric layer, includes supplying a first precursor at a temperature less than 400 degrees Celsius to a chamber including a substrate. The first precursor includes dysprosium. A first reaction gas is supplied to the chamber to react with the first precursor. A second precursor is supplied at a temperature less than 400 degrees Celsius to the chamber, and the second precursor includes scandium. A second reaction gas is supplied to the chamber to react with the second precursor.

It should be appreciated, that the second precursor and the second reaction gas may be supplied to the chamber before supplying the first precursor and first reaction gas.

Both dysprosium and scandium are relatively heavy atomic weight materials, and therefore, maintaining these materials in their gas phase requires temperatures of 250-400 Celsius. Accordingly, in one embodiment of the present invention, the dysprosium and scandium are supplied in their liquid phase to a vaporizer co-located with the deposition chamber. This eliminates the need to maintain the supply lines from the canisters containing the dysprosium and scandium to the deposition chamber at the 250-400 Celsius temperatures.

Thanks to this deposition process, dielectrics including dysprosium and scandium may be applied to integrated circuits in ways previously prohibited by the limitations of conventional deposition techniques.

For example, according to one embodiment of the present invention, the method of forming an integrated circuit device includes forming a first layer over a substrate, forming a first dielectric layer including dysprosium and scandium by atomic layer deposition over the first layer; and forming a second layer over the first dielectric layer.

Resulting integrated circuit devices include a capacitor, flash memory structures, etc. For example, according to one embodiment, a memory device includes a first electrode formed over a substrate, a first dielectric layer formed on the first electrode, and a second dielectric layer formed on the first dielectric layer. The second dielectric layer includes scandium and dysprosium. A second electrode may be formed over the second dielectric layer.

In another example embodiment, the memory device includes an insulating layer formed over a substrate, and a first dielectric layer including dysprosium and scandium formed over the insulating layer. A gate electrode layer may be formed over the first dielectric layer.

BRIEF DESCRIPTION OF THE DRAWINGS

The present invention will become more fully understood from the detailed description given herein below and the accompanying drawings, wherein like elements are represented by like reference numerals, which are given by way of illustration only and thus are not limiting of the present invention and wherein.

DETAILED DESCRIPTION OF EXAMPLE EMBODIMENTS

Example embodiments will now be described more fully with reference to the accompanying drawings. However, example embodiments may be embodied in many different forms and should not be construed as being limited to the example embodiments set forth herein. Example embodiments are provided so that this disclosure will be thorough, and will fully convey the scope to those who are skilled in the art. In some example embodiments, well-known processes, well-known device structures, and well-known technologies are not described in detail to avoid the unclear interpretation of the example embodiments. Throughout the specification, like reference numerals in the drawings denote like elements.

It will be understood that when an element or layer is referred to as being "on", "connected to" or "coupled to" another element or layer, it may be directly on, connected or coupled to the other element or layer, or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
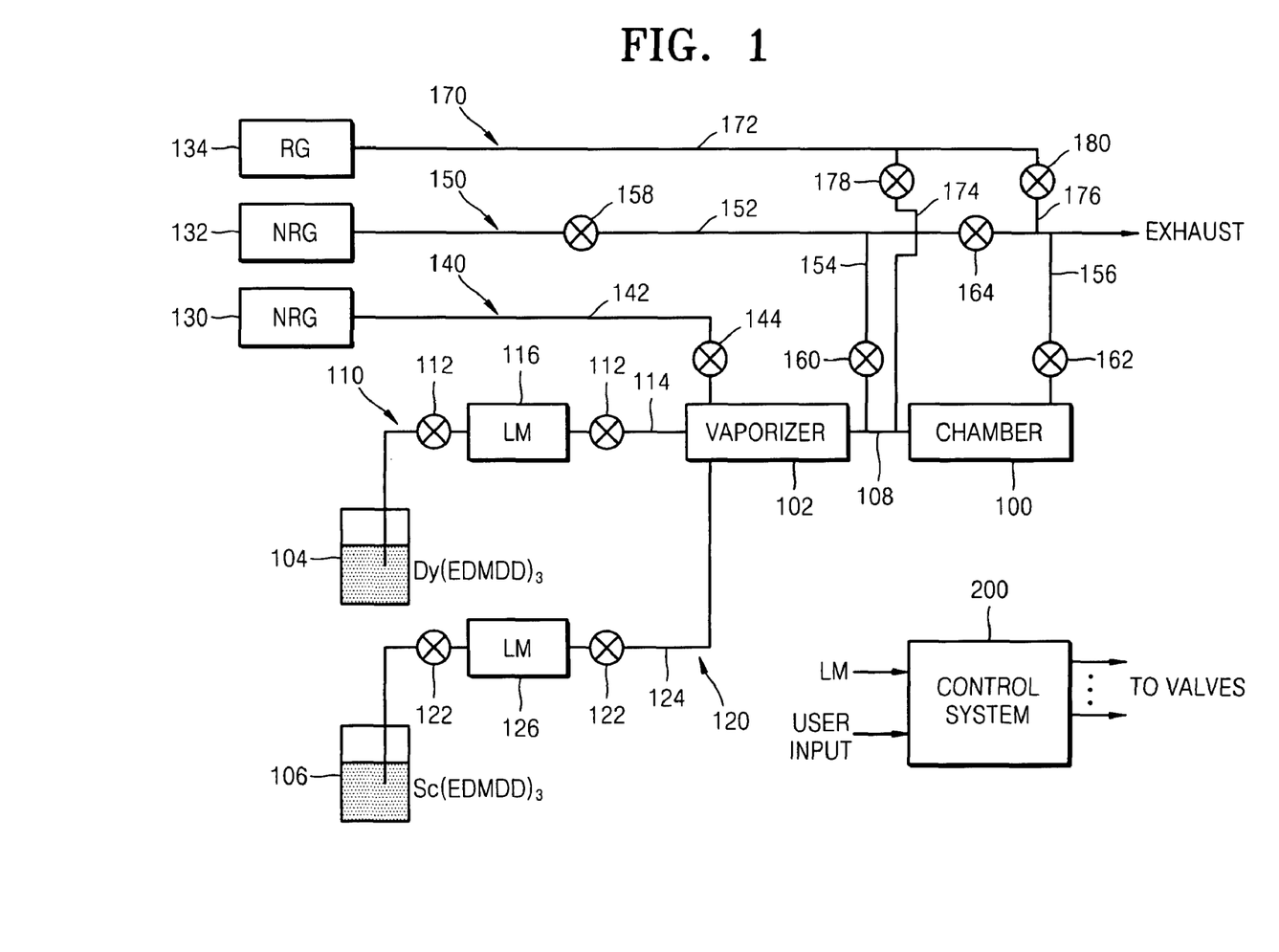
FIG. 1 schematically illustrates an atomic layer deposition (ALD) system according to an embodiment of the present invention.

FIG. 1 schematically illustrates an atomic layer deposition (ALD) system according to an embodiment of the present invention. It will be understood that various well-known elements of the ALD system have not been shown for the sake of clarity.

As shown, the system includes a deposition chamber 100 in which a target, such as a substrate, for deposition is placed. Co-located with the deposition chamber 100 is a vaporizer 102. Namely, the vaporizer 102 is located near, approximate or bordering the deposition chamber 108 such that heating the supply line 108, which connects the vaporizer 102 with deposition chamber 100, is not required to maintain the gas phase of material exiting the vaporizer 102 and destined for the deposition chamber 100. A first container 104 stores a liquid phase of a first precursor including dysprosium. In one embodiment, the first precursor is $Dy(EDMDD)_3$. A second container 106 stores a liquid phase of a second precursor including scandium. In one embodiment, the second precursor is $Sc(EDMDD)_3$.

A first supply line system 110 provides fluid communication from the first container 104 to the vaporizer 102. The first supply line system 110 includes one or more valves 112 in a supply line 114 and at least one liquid flow monitor 116. The liquid flow monitor 116 detects the flow of the first precursor through the supply line 114, and outputs the detected flow to a control system 200.

A second supply line system 120 provides fluid communication from the second container 106 to the vaporizer 102. The second supply line system 120 includes one or more valves 122 in a supply line 124 and at least one liquid flow monitor 126. The liquid flow monitor 126 detects the flow of the second precursor through the supply line 124, and outputs the detected flow to the control system 200.

In addition to the first and second containers 104 and 106, the ALD system includes third, fourth and fifth containers 130, 132 and 134. The fifth container 134 stores a reaction gas, and the third and fourth containers 130 and 132 store a non-reactive gas such as argon. A third supply line system 140 includes a supply line 142 connecting the third container 130 with the vaporizer 102, and includes a valve 144 disposed in the supply line 142. A fourth supply line system 150 includes a supply line 152 connected to the fourth container 132 and an exhaust. A supply line 154 connects the supply line 152 to the supply line 108, and a supply line 156 connects the supply line 152 to the deposition chamber 100. A valve 158 is disposed in the supply line 152 up stream from the connection points of the supply lines 154 and 156, and a valve 164 is disposed in the supply line 152 between the connection points of the supply lines 154 and 156. A valve 160 is disposed in the supply line 154, and a valve 162 is disposed in the supply line 156. A fifth supply line system 170 includes a supply line 172 that is connected to the fifth container 134. A supply line 174 connects the supply line 172 with the supply line 108, and a supply line 176 connects the supply line 172 with the supply line 152 down stream of the valve 164. A valve 178 is disposed in the supply line 174, and a valve 180 is disposed in the supply line 176.

Each of the above described valves controls flow through the associated supply line. The control system 200 controls the valves. In particular, the control system 200 receives user input and controls operation of the ALD system based on the user input and the output of sensors like the liquid flow monitors 116 and 126. In controlling the operation, the control system 200 controls the degree to which the valves are opening and the timing of the opening/closing of the valves.

Figure 2A:
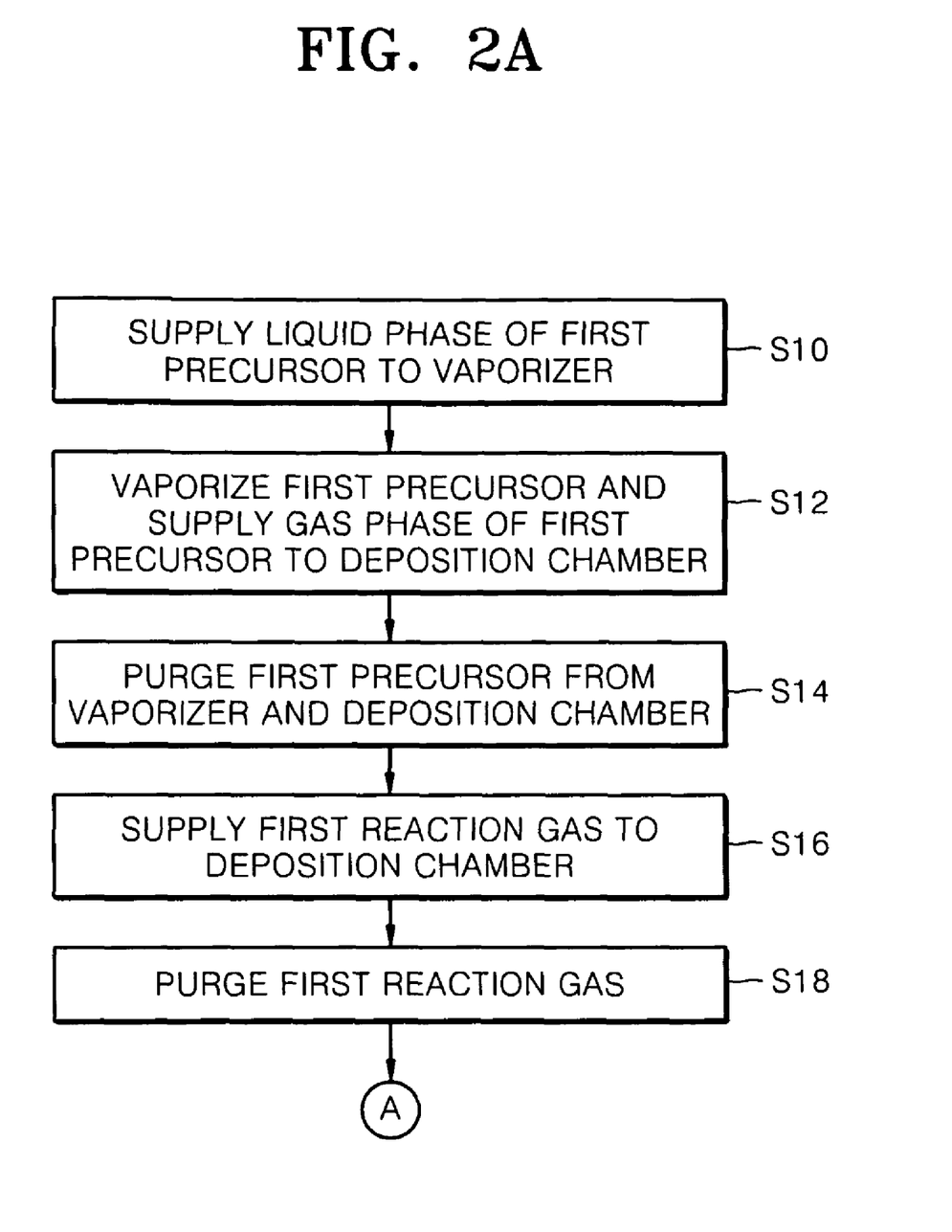
FIGS. 2A-2B illustrates a flow chart of the ALD system operation according to one embodiment of the present invention.
Figure 2B:
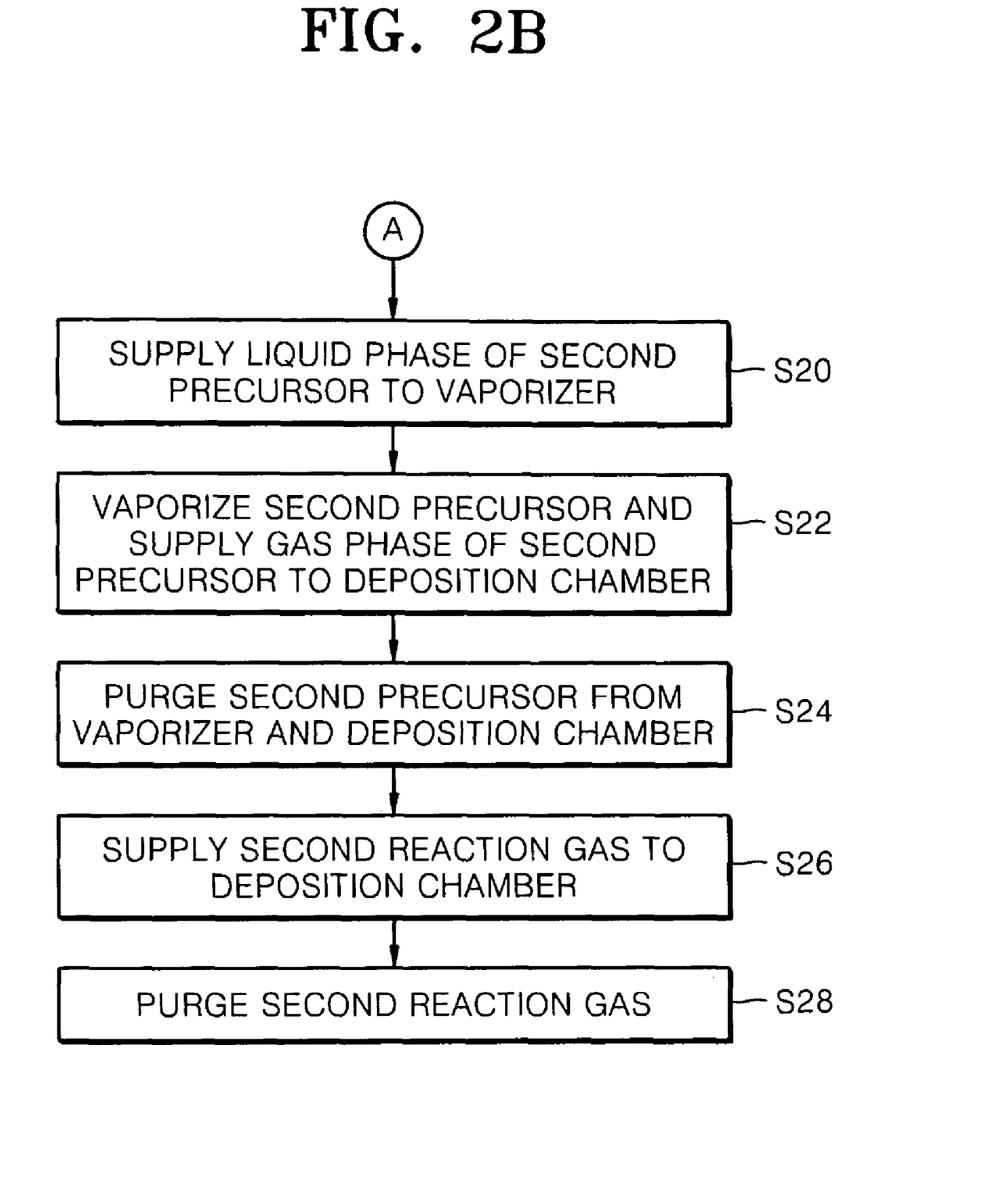

Next, operation of the ALD system will be described with respect to FIGS. 2A-2B. FIGS. 2A-2B illustrates a flow chart of the ALD system operation according to one embodiment of the present invention. For the purposes of explanation assume all valves in the system of FIG. 1 are initially closed. As shown, in step S10 the control system 200 opens the valves 112 so that the liquid phase of the first precursor flows into the vaporizer 102 from the container 104. The control system 200 controls the valves 112 to achieve a desired flow rate for the designed formation of the dielectric layer. It will be understood that the flow rate is a design parameter that will change depending on the desired characteristics of the dielectric being formed. For example, flow rate affects deposition rate, thickness, step coverage, etc. of the dielectric.

Figure 3A:
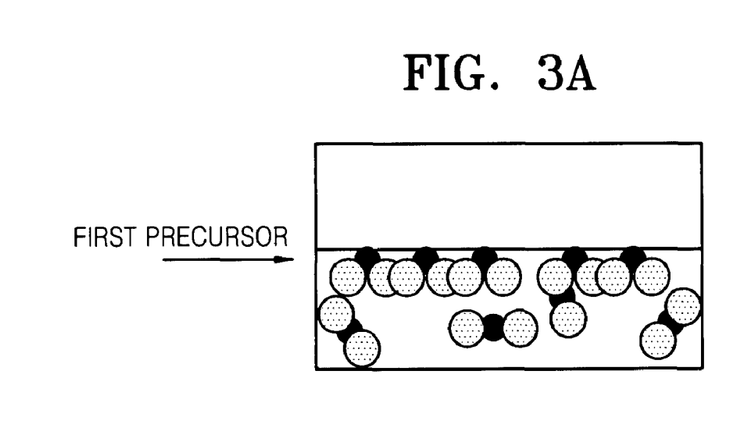
FIGS. 3A-3D graphically show the process results of steps S12, S14, S16 and S18, respectively in FIGS. 2A-2B.

In step S12, the vaporizer 102 vaporizes the first precursor to convert the liquid phase of the first precursor to the gas phase. For example, the vaporizer 102 may heat the first precursor of a temperature of up to 400 degrees Celsius. In one embodiment, the temperature is 160-200 degrees Celsius. The gas phase of the first precursor is supplied to the deposition chamber 100 by the supply line 108. For example, in one embodiment, the gas phase of the first precursor may have a pressure of 0.1 to 10 mbar. Because the vaporizer 102 is co-located with the deposition chamber 100, which results in a short supply line 108, no heating of the supply line 108 is needed to prevent the first precursor from reverting back to the liquid phase. The deposition chamber 100 is heated to a temperature less than 400 degrees Celsius. In one embodiment, the deposition temperature is 200-400 degrees Celsius. The substrate in the deposition chamber 100 chemisorbs and physisorbs the first precursor as graphically shown in FIG. 3A.

Figure 3B:
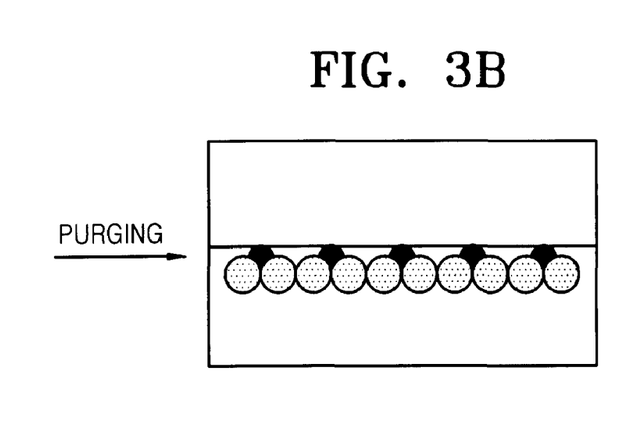

In step S14, the first precursor is purged from the vaporizer 102 and the deposition chamber 100. In particular, the control system 200 closes the valves 112, and then opens the valves 144, 160 and 162. The control system 200 also maintains the valve 164 in a closed position. A non-reactive gas such as argon will flow from the containers 130 and 132 through the vaporizer 102 and 100, and flow out the exhaust. Carried away with the argon will be the first precursor in the vaporizer 102 and the deposition chamber 100. This purging of the first precursor removes the first precursor physisorbed by the substrate leaving the first precursor chemisorbed by the substrate as graphically shown in FIG. 3B. After purging the first precursor, the valves 144, 160 and 162 are closed.

Figure 3C:
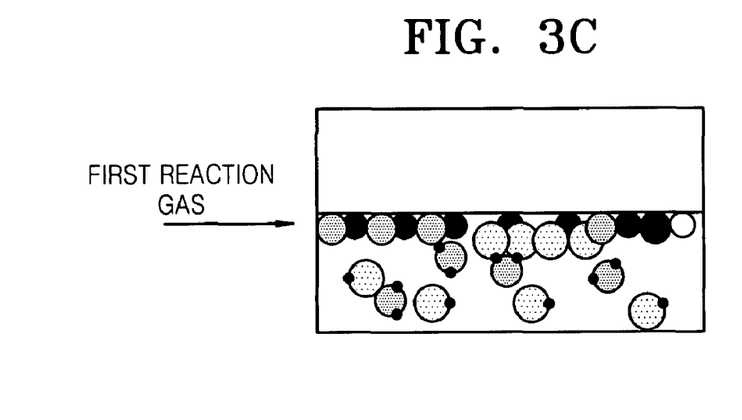
Figure 3D:
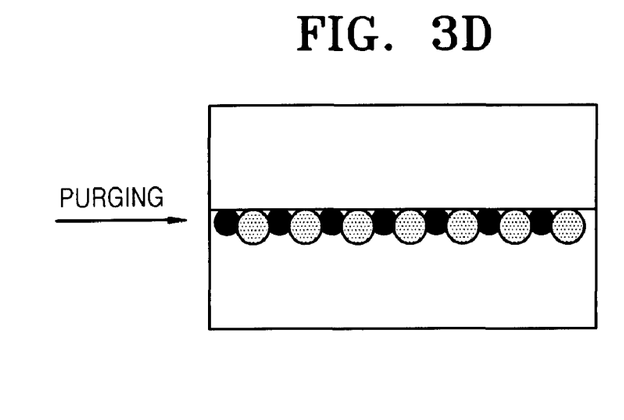

In step S16, a first reaction gas for reacting with the first precursor is supplied to the deposition chamber 100. For example, the valve 178 is opened to supply the reacting gas from the third container to the deposition chamber 100. The reaction gas may be $O_3$, $O_2$, $H_2O$, $H_2O_2$, $N_2$, $NH_3$, $H_2$, etc. For example, when the reaction gas includes oxygen, the reaction gas causes the first precursor to oxidize. As a result, a deposition layer such as DyO is formed over the substrate and volatile by-products are produced. This is graphically shown in FIG. 3C. The reaction gas and by-products are then purged from the deposition chamber 100 by closing valve 178 and opening valves 160 and 162 in step S18. This is graphically shown in FIG. 3D. After purging, the valves 160 and 162 are closed.

In step S20, the control system 200 opens the valves 122 so that the liquid phase of the second precursor flows into the vaporizer 102 from the container 106. The control system 200 controls the valves 122 to achieve a desired flow rate for the designed formation of the dielectric layer. It will be understood that the flow rate is a design parameter that will change depending on the desired characteristics of the dielectric being formed. For example, flow rate affects deposition rate, thickness, step coverage, etc. of the dielectric.

In step S22, the vaporizer 102 vaporizes the second precursor to convert the liquid phase of the second precursor to the gas phase. For example, the vaporizer 102 may heat the second precursor at a temperature of up to 400 degrees Celsius. In one embodiment, the temperature is 160-200 degrees Celsius. The gas phase of the second precursor is supplied to the deposition chamber 100 by the supply line 108. For example, in one embodiment, the gas phase of the second precursor may have a pressure of 0.1 to 10 mbar. Because the vaporizer 102 is co-located with the deposition chamber 100, which results in a short supply line 108, no heating of the supply line 108 is needed to prevent the second precursor from reverting back to the liquid phase. The deposition chamber 100 is heated to a temperature less than 400 degrees Celsius. In one embodiment, the deposition temperature is 200-400 degrees Celsius.

In step S24, the second precursor is purged from the vaporizer 102 and the deposition chamber 100. In particular, the control system 200 closes the valves 122, and then opens the valves 144, 160 and 162. The control system 200 also maintains the valve 164 in a closed position. A non-reactive gas such as argon will flow from the containers 130 and 132 through the vaporizer 102 and 100, and flow out the exhaust. Carried away with the argon will be the second precursor in the vaporizer 102 and the deposition chamber 100. This purging of the second precursor removes the second precursor physisorbed by the substrate leaving the second precursor chemisorbed by the substrate. After purging the second precursor, the valves 144, 160 and 162 are closed.

In step S26, a second reaction gas for reacting with the first precursor is supplied to the deposition chamber 100. For example, the valve 178 is opened to supply the reaction gas from the third container to deposition chamber 100. In this embodiment, the first and second reaction gases are the same. As a result, only a single reaction gas container 134 and associated supply line system 170 has been shown. However, it will be understood, that the first and second reaction gases may be different. In such an embodiment, additional reaction gas containers and associated supply line systems will be provided. Assuming, again, the example that the reaction gas includes oxygen, the reaction gas causes the second precursor to oxidize. As a result, $D_xS_yO_3$ is formed over the substrate and volatile by-products are produced. The reaction gas and by-products are then purged from the deposition chamber 100 by closing valve 178 and opening valves 160 and 162 in step S28. After purging, the valves 160 and 162 may be closed.

The process of FIGS. 2A-2B forms a single layer of $D_xS_yO_3$. The process of FIGS. 2A-2B may be repeated a desired number of times to form a dielectric layer of desired thickness. As will be appreciated, because each cycle of FIGS. 2A-2B forms an extremely thin layer, this process of forming a dielectric including dysprosium and scandium permits nano-thickness control of the dielectric produced.

Furthermore, the present invention is not limited in processing order to the example embodiment of FIGS. 2A-2B. For example, in an alternative embodiment, process steps S20-S28 may be performed before process steps S10-S18.

Next various applications of the above-described process to integrated circuits will be provided. However, it will be understood that the examples given are just that, examples, and are not an exhaustive list of possible applications.

Figure 4:
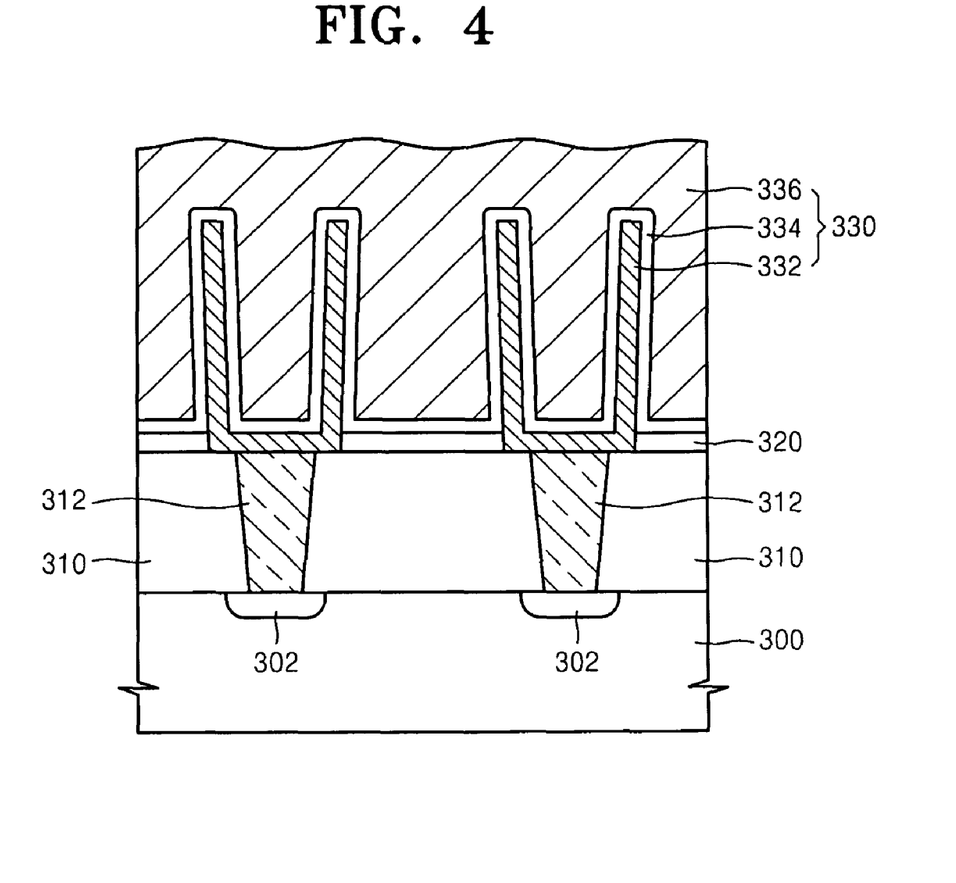
FIG. 4 illustrates a capacitor having a dielectric layer including dysprosium and scandium formed according to an embodiment of the present invention.

FIG. 4 illustrates a capacitor having a dielectric layer including dysprosium and scandium formed according to an embodiment of the present invention. As shown, a semiconductor substrate 300 includes one or more drain regions 302. A first insulating layer 302 is formed over the substrate 300 and includes holes exposing the drain regions 302. The insulating layer 310 may be an oxide layer. Conductive plugs 312 are formed in the holes and in contact with the drain regions 302. A second insulation layer 320 is formed over the substrate 300, and includes holes exposing the conductive plugs 312. The second insulation layer 320 may be a nitride layer. First electrodes 332 are formed partially in the holes of the second insulation layer 320 in contact with the conductive plugs 312. The first electrodes 332 may have various shapes and forms. In the embodiment of FIG. 4, the first electrodes 332 have a U-shape. A dielectric structure 334 is formed over the substrate 100 and on the first electrodes 332. A second electrode 336 is formed over the substrate 100 and on the dielectric structure 334. The first electrode 332, the dielectric structure 334 and the second electrode 336 form a capacitor 330. The first and second electrodes 332 and 334 may include at least one of Ti, TiN, Ta, TaN, W, WN, Ru, Cu, Al, RuO$_2$, Ir, IrO, Pt, poly-silicon, etc.

Figure 5:
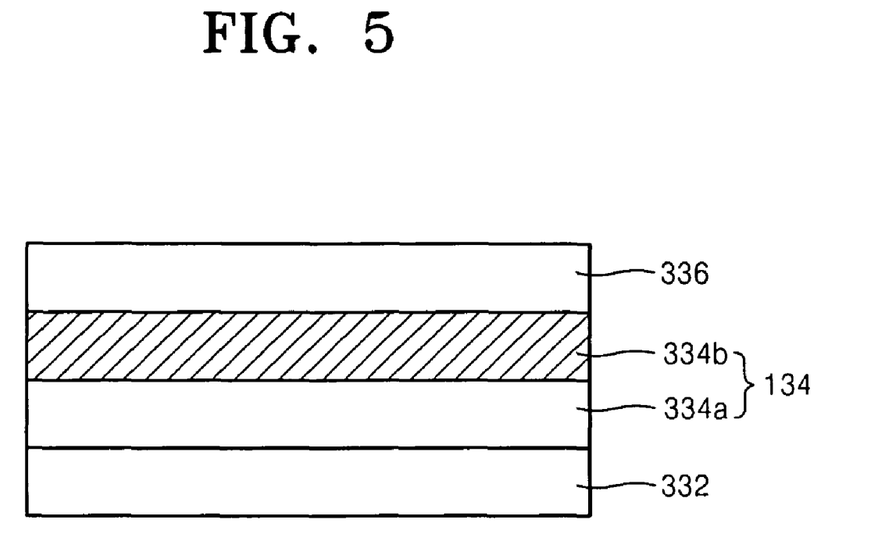
FIG. 5 illustrates the layers forming the capacitor of FIG. 4 according to one embodiment of the present invention.

FIG. 5 illustrates the layers forming the capacitor 330 of FIG. 4 according to one embodiment of the present invention. As shown, the dielectric structure 334 disposed between the first and second electrodes 332 and 336 may include multiple layers. In the embodiment of FIG. 5, the dielectric structure 334 includes a high dielectric constant layer 334a formed on the first electrode 332. The high dielectric constant layer 334a may be at least one of ZrO$_2$, HfO$_2$, BST, STO, TaO$_2$, La$_2$O$_3$, a mixture thereof, etc.

A dielectric layer 334b including dysprosium and scandium is formed on the high dielectric constant layer 334a according an embodiment of the present invention. For example, DyScO$_3$ is formed using the method described above with respect to FIGS. 2A-2B. The second electrode 336 is formed on the dielectric layer 334b.

Figure 6:
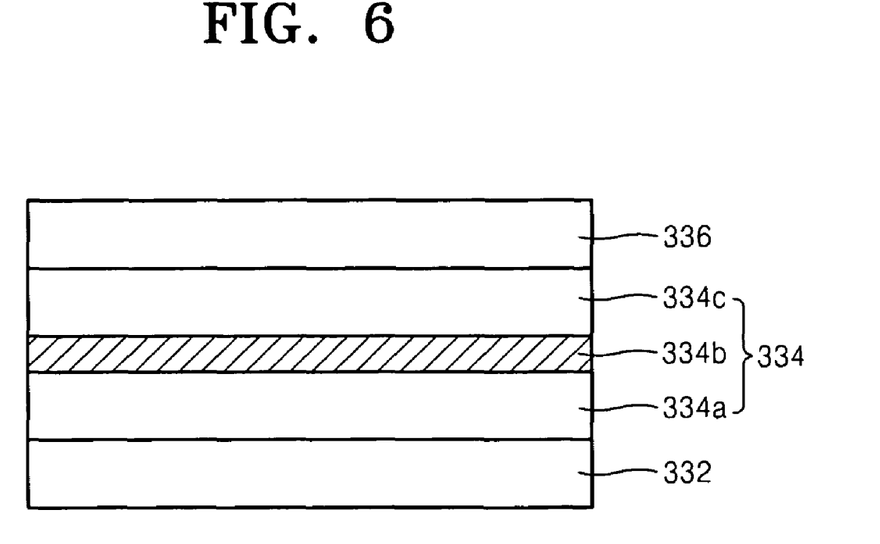
FIG. 6 illustrates the layers forming the capacitor of FIG. 4 according to another embodiment of the present invention.

FIG. 6 illustrates the layers forming the capacitor 330 of FIG. 4 according to another embodiment of the present invention. As shown, the dielectric structure 334 disposed between the first and second electrodes 332 and 336 may include multiple layers. In the embodiment of FIG. 6, the dielectric structure 334 includes a first high dielectric constant layer 334a formed on the first electrode 332. The first high dielectric constant layer 334a may be at least one of ZrO$_2$, HfO$_2$, BST, STO, TaO$_2$, La$_2$O$_3$, a mixture thereof, etc.

A dielectric layer 334b including dysprosium and scandium is formed on the high dielectric constant layer 334a according an embodiment of the present invention. For example, DyScO$_3$ is formed using the method described above with respect to FIGS. 2A-2B. A second high dielectric constant layer 334c is formed on the dielectric layer 334b. The second high dielectric constant layer 334c may be at least one of ZrO$_2$, HfO$_2$, BST, STO, TaO$_2$, La$_2$O$_3$, a mixture thereof, etc. The first and second high dielectric constant layers 334a and 334c may be formed of the same or different material. The second electrode 336 is formed on the second high dielectric constant layer 334c.

Figure 7:
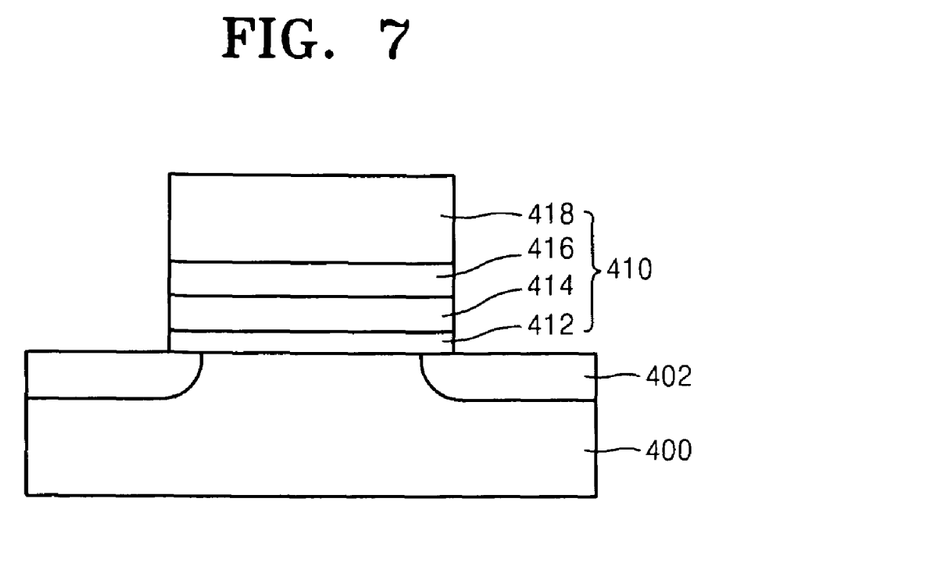
FIG. 7 illustrates a CTF type flash structure according to an embodiment of the present invention.

FIG. 7 illustrates a CTF type flash structure according to an embodiment of the present invention. As shown, a flash structure 410 is formed on a substrate 400. Doped regions 402 may be formed in the substrate 400 on either side of the flash structure 410. The flash structure 410 includes a tunnel insulation layer 412, a charge storage layer 414, a dielectric structure 416, and a gate electrode layer 418. The tunnel insulation layer 412 may be a tunnel oxide layer. The charge storage layer 414 may include at least one of HfO, HfON, HfCN, AlN, SiN, GaN, GeN, TaO, MTaO, TiO, MTiO, a combination thereof, multiple layers thereof, etc. The dielectric structure 416 will be discussed below with respect to FIG. 8. The gate electrode 418 may include poly silicon, etc.

Figure 8:
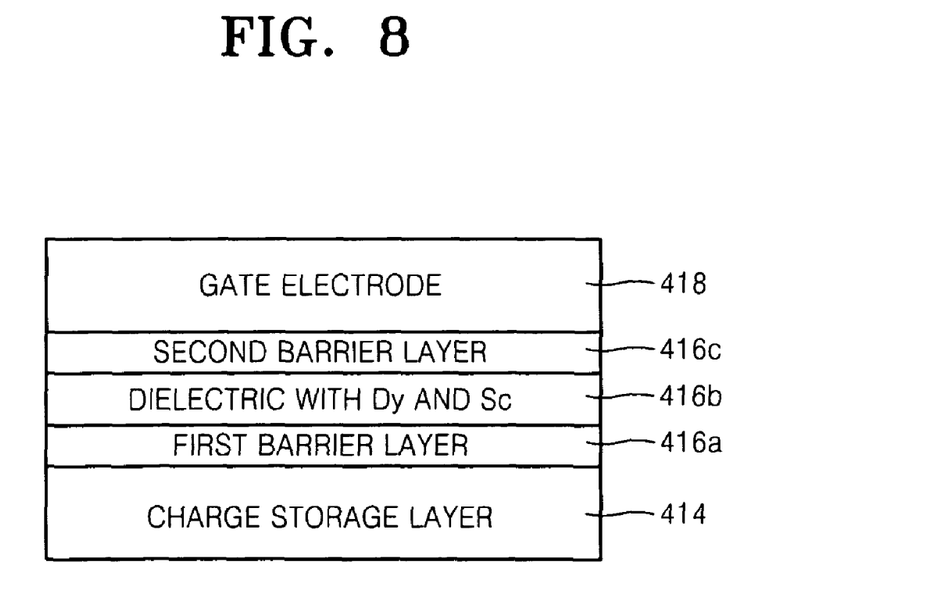
FIG. 8 illustrates one embodiment of the dielectric structure in FIG. 7.

FIG. 8 illustrates one embodiment of the dielectric structure in FIG. 7. As shown, the dielectric structure 416 includes a first barrier layer 416a formed on the charge storage layer 414. A dielectric layer 416b including dysprosium and scandium is formed on the first barrier layer 416a according to an embodiment of the present invention. For example, DyScO$_3$ may be formed using the method described above with respect to FIGS. 2A-2B. A second barrier layer 416c is formed over the dielectric layer 416b. The first and second barrier layers 416a and 416c may be formed of respective materials to prevent the dielectric layer 416b from reacting with the charge storage layer 414 and the gate electrode layer 418. For example, the first and second barrier layers 416a and 416c may be formed of Al$_2$O$_3$, SiO$_2$, etc. Also, the first and second barrier layers 416a and 416c may be of the same or different material. As an alternative, one of or both of the first and second barrier layers 416a and 416c may be eliminated.

Figure 9:
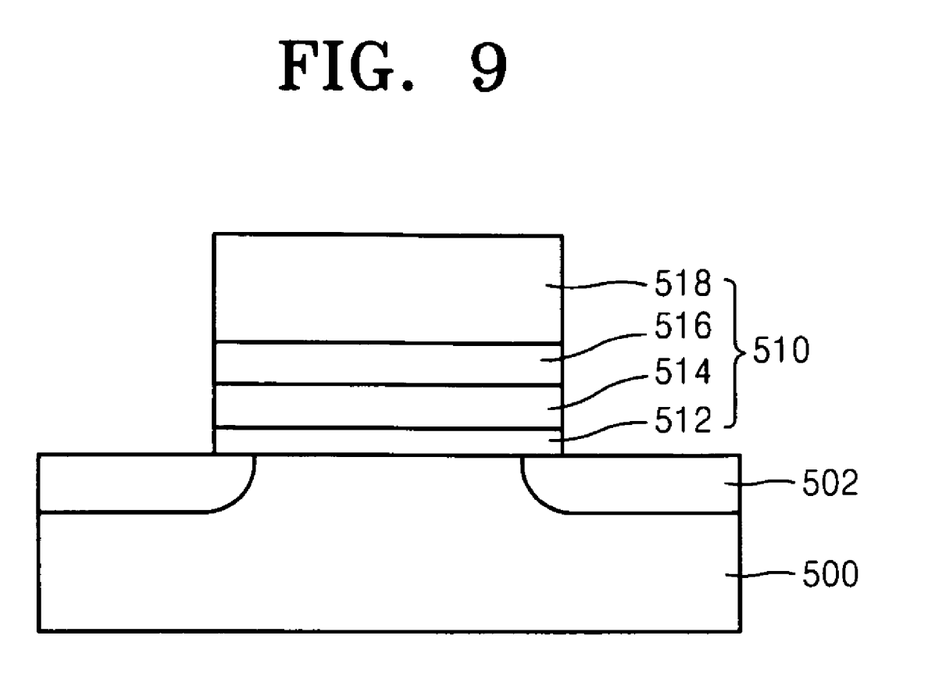
FIG. 9 illustrates another flash memory structure according to an embodiment of the present invention.

FIG. 9 illustrates another flash memory structure according to an embodiment of the present invention. As shown, a flash structure 510 is formed on a substrate 500. Doped regions 502 may be formed in the substrate 500 on either side of the flash structure 510. The flash structure 510 includes a tunnel insulation layer 512, a floating gate layer 514, a dielectric structure 516, and a gate electrode layer 518. The tunnel insulation layer 512 may be a tunnel oxide layer. The floating gate layer 514 and the gate electrode 518 may be formed of poly silicon, etc. The dielectric structure 516 may have the same structure as the dielectric structure 416 described above with respect to FIG. 8.

The invention being thus described, it will be obvious that the same may be varied in many ways. Such variations are not to be regarded as a departure from the invention, and all such modifications are intended to be included within the scope of the invention.

We claim:

1. A method of forming a dielectric layer, comprising:
   supplying a first precursor at a temperature less than 400 degrees Celsius to a chamber including a substrate, the first precursor including dysprosium;
   supplying a first reaction gas to the chamber to react with the first precursor;
   supplying a second precursor at a temperature less than 400 degrees Celsius to the chamber, the second precursor including scandium; and
   supplying a second reaction gas to the chamber to react with the second precursor.

2. The method of claim 1, wherein the first and the second precursors are supplied at a temperature between 160 and 200 degrees Celsius.

3. The method of claim 1, further comprising:
   purging the chamber after supplying the first and second reaction gas.

4. The method of claim 1, further comprising:
   repeating the supplying steps.

5. The method of claim 1, wherein the supplying a first precursor comprises:
   delivering the first precursor in a liquid phase to a vaporizer;
   vaporizing the liquid phase of the first precursor to produce a gas phase of the first precursor; and
   delivering the gas phase of the first precursor to the chamber.

6. The method of claim 5, wherein the delivery of the first precursor is to a vaporizer co-located with the chamber.

7. The method of claim 1, wherein the supplying a second precursor comprises:
   delivering the second precursor in a liquid phase to the vaporizer;
   vaporizing the liquid phase of the second precursor to produce a gas phase of the second precursor; and
   delivering the gas phase of the second precursor to the chamber.

8. The method of claim 7, wherein the delivery of the second precursor is to a vaporizer co-located with the chamber.

9. The method of claim 1, wherein the dielectric layer is DyScO$_3$.

10. The method of claim 1, wherein the first precursor is Sc(EDMDD) and the second precursor is Dy(EDMDD)$_3$.

11. The method of claim 1, further comprising:
heating the chamber to a temperature less than 400 degrees Celsius.

12. A method of forming an integrated circuit device, comprising:
forming a first layer over a substrate;
forming a charge storage layer over the first layer; and
forming a second layer including DyScO3 by atomic layer deposition over the charge storage layer.

13. The method of claim 12, further comprising:
forming a first barrier layer over the second layer.

14. The method of claim 12, wherein the first layer is dielectric layer.

15. A method of forming an integrated circuit device, comprising:
forming a first layer over a substrate;
forming a charge storage layer over the first layer;
forming a second layer including dysprosium and scandium by atomic layer deposition over the charge storage layer; and
forming a third layer on the second layer.

16. The method of claim 15, wherein the third layer is electrode layer.

17. The method of claim 16, wherein the third layer includes at least one of Ti, TiN, Ta, TaN, W, WN, Ru, Cu, Al, RuO2, Ir, IrO2, Pt and Poly-Si.

18. The method of claim 15, further comprising:
forming a first barrier layer over the second layer.

19. The method of claim 15, wherein the third layer includes at least one of Zr, Hf, BST, STO, Ta, and La.

20. The method of claim 15, wherein the first layer is dielectric layer.

21. A method of forming an integrated circuit device, comprising:
forming a first layer over a substrate;
forming a charge storage layer over the first layer; and
forming a second layer including dysprosium and scandium by atomic layer deposition over the charge storage layer,
wherein at least one of the first and second layers includes at least one of Zr, Hf, BST, STO, Ta, and La.

22. The method of claim 21, wherein the first layer is dielectric layer.

23. The method of claim 21, further comprising:
forming a first barrier layer over the second layer.

* * * * *